(12) United States Patent
Tian et al.

(10) Patent No.: US 8,975,124 B2
(45) Date of Patent: Mar. 10, 2015

(54) THIN FILM TRANSISTOR, ARRAY SUBSTRATE AND PREPARATION METHOD THEREOF

(75) Inventors: Xueyan Tian, Beijing (CN); Chunping Long, Beijing (CN); Jiangfeng Yao, Beijing (CN)

(73) Assignees: Boe Technology Group Co., Ltd., Beijing (CN); Beijing Asahi Glass Electronics Co., Ltd., Beijing (CN)

( * ) Notice: Subject to any disclaimer, the term of this patent is extended or adjusted under 35 U.S.C. 154(b) by 42 days.

(21) Appl. No.: 13/471,911

(22) Filed: May 15, 2012

(65) Prior Publication Data
US 2012/0292628 A1 Nov. 22, 2012

(30) Foreign Application Priority Data
May 16, 2011 (CN) .......................... 2011 1 0125571

(51) Int. Cl.
| | | |
|---|---|---|
| H01L 21/00 | (2006.01) | |
| H01L 21/84 | (2006.01) | |
| H01L 27/14 | (2006.01) | |
| H01L 29/04 | (2006.01) | |
| H01L 29/15 | (2006.01) | |
| H01L 31/036 | (2006.01) | |
| H01L 29/10 | (2006.01) | |
| H01L 31/00 | (2006.01) | |

(Continued)

(52) U.S. Cl.
CPC .... H01L 29/78678 (2013.01); H01L 29/78696 (2013.01); H01L 29/66765 (2013.01)
USPC .......... 438/149; 438/150; 438/151; 438/152; 438/153; 438/154; 438/155; 438/156; 438/157; 438/158; 438/159; 438/160; 438/161; 438/162; 438/163; 438/164; 438/165; 438/166; 257/72; 257/49; 257/52; 257/57; 257/66

(58) Field of Classification Search
None
See application file for complete search history.

(56) References Cited

U.S. PATENT DOCUMENTS

| | | | |
|---|---|---|---|
| 2009/0061573 A1* | 3/2009 | Miyairi et al. ................. | 438/160 |
| 2009/0212289 A1* | 8/2009 | Gan et al. ......................... | 257/57 |

(Continued)

FOREIGN PATENT DOCUMENTS

WO   WO2012005030 A1 * 12/2012 ...................... 257/72

OTHER PUBLICATIONS

Compound Semiconductor, "Improving Efficiency Through Power Supply", Jul. 6, 2010, http://www.compoundsemiconductor.net/csc/features-details/19732094/Improving-efficiency-through-power-suppl.html.*

(Continued)

Primary Examiner — Steven Loke
Assistant Examiner — Juanita B Rhodes
(74) Attorney, Agent, or Firm — Ladas & Parry LLP

(57) ABSTRACT

One or more embodiments of the disclosed technology provide a thin film transistor, an array substrate and a method for preparing the same. The thin film transistor comprises a base substrate, and a gate electrode, a gate insulating layer, an active layer, an ohmic contact layer, a source electrode, a drain electrode and a passivation layer prepared on the base substrate in this order. The active layer is formed of microcrystalline silicon, and the active layer comprises an active layer lower portion and an active layer upper portion, and the active layer lower portion is microcrystalline silicon obtained by using hydrogen plasma to treat at least two layers of amorphous silicon thin film prepared in a layer-by-layer manner.

9 Claims, 5 Drawing Sheets

(51) Int. Cl.
*H01L 29/76* (2006.01)
*H01L 31/112* (2006.01)
*H01L 29/786* (2006.01)
*H01L 29/66* (2006.01)

(56) References Cited

U.S. PATENT DOCUMENTS

2011/0124164 A1* 5/2011 Noda et al. ............... 438/166
2013/0087802 A1* 4/2013 Kohno et al. ............... 257/72

OTHER PUBLICATIONS

Hsiao et al., "Influence of RF Bias on Hydrogenated Amorphous Silicon by High-Density Plasma Chemical Vapor Deposition", Mar. 20, 2007, Journal of the Electrochemical Society, 154, pp. G122-G126.*

Hsiao et al., "Influence of RF Bias on Hydrogenated Amorphous Silicon by High-Density Plasma Chemical Vapor Deposition", Journal of Electrochemical Society, Mar. 20, 2007.*

Compound Semiconductor, "Improving Efficiency Through Power Supply" http://www.compoundsemiconductor.net/csc/features-details/19732094/Improving-efficiency-through-power-suppl.html.*

Zhou Shun, et al; "On the deposition rate of amorphous silicon thin films", VACUUM, Edition 3, vol. 45, pp. 48-50, May 2008.

First Chinese Office Action dated Feb. 25, 2014; Appln. No. 201110125571.4.

Second Chinese Office Action dated Aug. 5, 2014; Appln. No. 201110125571.4.

Third Chinese Office Action Appln. No. 201110125571.4; Dated Nov. 15, 2014.

* cited by examiner

THIN FILM TRANSISTOR, ARRAY SUBSTRATE AND PREPARATION METHOD THEREOF

BACKGROUND

Embodiments of the disclosed technology relate to a thin film transistor (TFT), an array substrate and a preparation method thereof.

Presently, since active matrix organic light-emitting displays (AMOLEDs) and low temperature poly-silicon thin film transistor liquid crystal displays (LTPS TFT-LCDs) have advantages of high definition of image, short response time for moving images, lower power consumption, wide viewing angles and ultra-light and thin profiles, they may be among the best choices of display technology in future. However, an a-Si (amorphous silicon) thin film transistor (TFT) commonly used at present in the LCD industry has relatively low mobility, serious threshold voltage drift and bad stability, which renders a-Si TFTs difficult to be applied to a current-driving AMOLED.

Microcrystalline silicon is characterized in good stability, high uniformity of back plate and low process costs and therefore adapted to a display panel, such as an AMOLED, an LTPS TFT-LCD or the like of a big size. However, when a plasma enhanced chemical vapor deposition (PECVD) process is used to prepare an active layer in a thin film transistor, an incubation layer appears in the channel region of an active layer in its lower portion, which is the grown microcrystalline silicon material. This incubation layer results in a number of crystal boundaries and defects in the channel region of the active layer, which decreases the mobility of carriers and causes the response delay of a thin film transistor, low on/off response speed and instability of operating state.

SUMMARY

One or more embodiments of the disclosed technology provides a thin film transistor and a preparation method thereof, as well as a display panel, for improving the low carrier mobility of channel region, low on/off response speed and instability of operating state in a thin film transistor active layer.

One aspect of the disclosed technology provides a thin film transistor comprising a base substrate, and a gate electrode, a gate insulating layer, an active layer, an ohmic contact layer, a source electrode, a drain electrode and a passivation layer prepared on the substrate in this order, wherein the active layer is formed of microcrystalline silicon, and the active layer comprises an active layer lower portion and an active layer upper portion, and wherein the active layer lower portion is microcrystalline silicon obtained by using hydrogen plasma to treat at least two layers of amorphous silicon thin film prepared in a layer-by-layer manner.

Another aspect of the disclosed technology provides a preparation method for a thin film transistor comprising preparing a gate electrode and a gate insulating layer on a base substrate, preparing an active layer on the gate insulating layer, and preparing an ohmic contact layer, a source electrode, a drain electrode and a passivation layer on the active layer. The active layer comprises an active layer lower portion that contacts the gate insulating layer and an active layer upper portion, and preparing of the active layer on the gate insulating layer comprises: using a layer-by-layer growing process to prepare at least two layers of amorphous silicon thin film which are each treated by hydrogen plasma layer by layer to obtain microcrystalline silicon so as to form the active layer lower portion, and using a successive deposition process to prepare microcrystalline silicon so as to form the active layer upper portion.

Further another aspect of the disclosed technology provides an array substrate comprising the thin film transistor described above.

Still further another aspect of the disclosed technology also provides a display comprising the array substrate described above.

Still further another aspect of the disclosed technology further provides a preparation method for an array substrate. The preparation method for the thin film transistor on the array substrate includes the preparation method for a thin film transistor described above.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

For those skilled in the related technical field to better understand the technical solutions of the disclosed technology, a thin film transistor and a preparation method thereof according to the embodiments of the disclosed technology will be described in detail in conjunction with the accompanying drawings.

Figure 1:
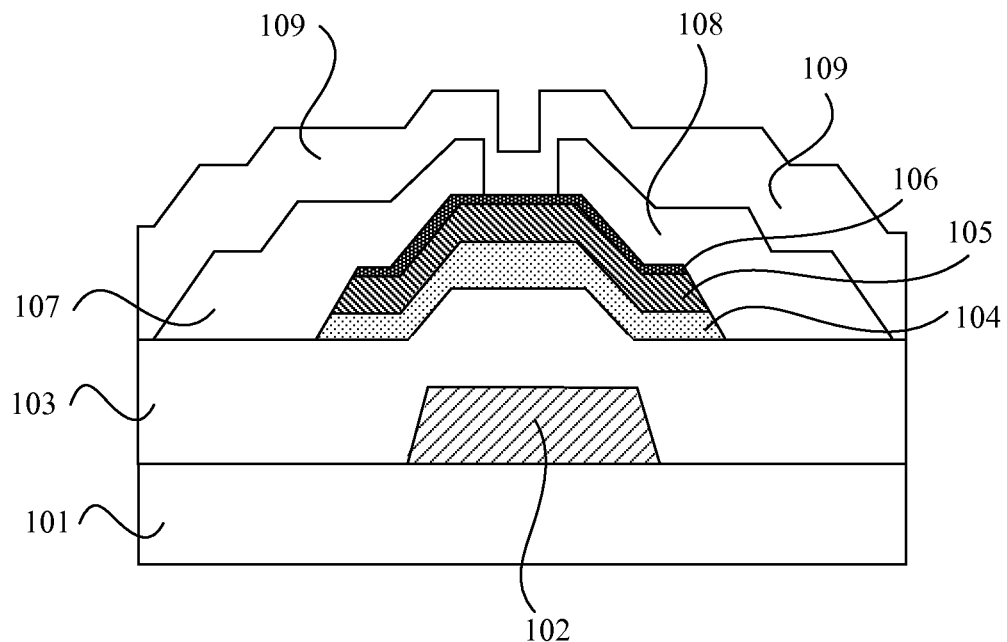
FIG. 1 is a structure schematic view of an embodiment of a thin film transistor according to the disclosed technology.

FIG. 1 is a structure schematic view of a thin film transistor of an embodiment in the disclosed technology. As shown in FIG. 1, the thin film transistor in the embodiment comprises a base substrate 101 and as well as a gate electrode 102, a gate insulating layer 103, an active layer, an ohmic contact layer 106, a source electrode 107, a drain electrode 108 and a passivation layer 109 prepared on the base substrate 101 in this order. The active layer comprises an active layer lower portion 104 on the gate insulating layer 103 and an active layer upper portion 105. The active layer lower portion 104 is a channel region of the active layer, which is formed of microcrystalline silicon obtained by treating with hydrogen plasma at least two layers of amorphous silicon thin film in a layer-by-layer manner. The active layer upper portion 105 is formed of microcrystalline silicon obtained from deposition in a successive deposition process. The microcrystalline silicon forming the active layer lower portion 104 is obtained by forming two or more layers of amorphous silicon thin film by PECVD and then treating each layer of amorphous silicon thin film with hydrogen plasma. The active layer lower portion 104 formed by this microcrystalline silicon can improve the mobility of carriers and the on/off response speed in the thin film transistor by reducing the crystal boundaries and defects of the active layer lower portion 104 and decrease the power consumption of the thin film transistor.

In one example, the active layer lower portion 104 has a thickness in a range of 30~50 nm, for example, 40 nm, and the active layer upper portion 105 has a thickness in a range of 100~150 nm, for example, 130 nm.

Figure 2:
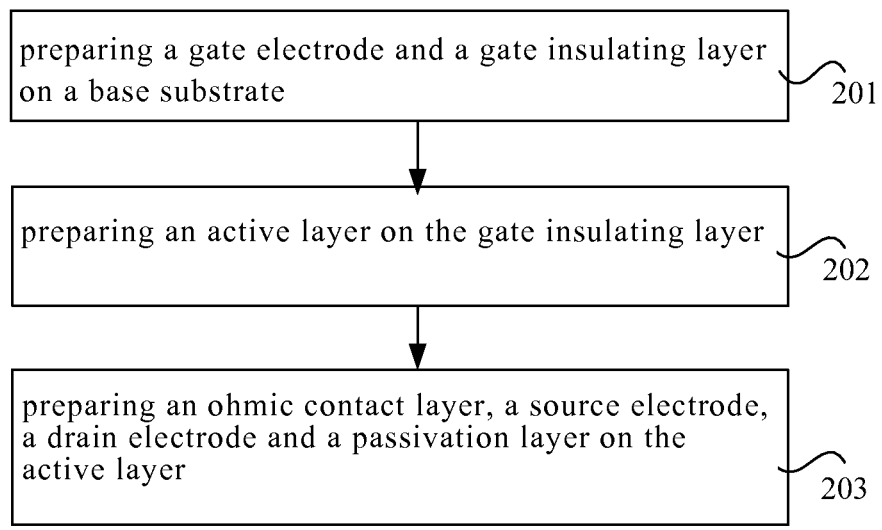
FIG. 2 is a flowchart of a first embodiment of a preparation method of the thin film transistor according to the disclosed technology.

FIG. 2 is a flowchart of a first embodiment of a preparation method of a thin film transistor according to the disclosed technology. As shown in FIG. 2, the process of the preparation method of a thin film transistor in the embodiment comprises the following steps.

Step 201 of Preparing a Gate Electrode and a Gate Insulating Layer on a Base Substrate.

In this embodiment, the structure of a thin film transistor shown in FIG. 1 is taken as an example. For example, a glass or quartz substrate is used as a base substrate 101, and a gate electrode 102 and a gate insulating layer 103 are prepared on the base substrate 101 in this order. The gate electrode 102 may be formed by patterning a metal layer such as molybdenum. The gate insulating layer 103 may be formed by using an insulating material such as silicon nitride or the like, for example, which is deposited on the entire base substrate 101. After preparing of the gate electrode 102 and the gate insulating layer 103, the method proceeds to step 202.

Step 202 of Preparing an Active Layer on the Gate Insulating Layer.

In this step, the surface of the gate insulating layer 103 may be treated by hydrogen plasma prior to preparing of the active layer for example. Then, a microcrystalline silicon thin film for forming the active layer lower portion 104 is prepared to a layered structure and formed in a layer-by-layer growing process. The layer-by-layer growing process comprises a step of preparing an amorphous silicon thin film layer by PECVD, performing hydrogen plasma treatment on this amorphous silicon thin film to convert it into microcrystalline silicon, and then this step is repeated no less than one time to obtain layers of microcrystalline silicon. The layer-by-layer growing process comprises at least two PECVD processes, each of which is used to prepare a layer of amorphous silicon thin film, which is then undergone a hydrogen plasma treatment to form a microcrystalline silicon thin film. The layered microcrystalline silicon of different thicknesses can be obtained with different number of the PECVD processes and the corresponding hydrogen plasma treatments.

In the various embodiments of the disclosed technology, the amorphous silicon thin film layer formed in each PECVD process may has a thickness less than 10 nm in the layer-by-layer growing process. Microcrystalline silicon with high quality may be obtained with the layers of amorphous silicon thin film of the thickness less than 10 nm, each of which is treated by hydrogen plasma to convert to microcrystalline silicon.

After preparing of the active layer lower portion 104, a microcrystalline silicon layer is formed on the active layer lower portion 104 by a successive deposition process so as to obtain the active layer upper portion 105. Preparation of the active layer upper portion 105 with the successive deposition process can enhance the efficiency of the preparation of the thin film transistor. Examples of the successive deposition process may include PECVD, low pressure chemical vapor deposition (LPCVD), hot wire chemical vapor deposition (HWCVD), or sputtering deposition. In one example of the embodiment, after preparing of the active layer upper portion 105 using PECVD, the method proceeds to step 203.

Step 203 of Preparing an Ohmic Contact Layer, a Source Electrode, a Drain Electrode and a Passivation Layer on the Active Layer.

In this step, firstly an heavily-doped amorphous silicon (n+a-Si:H) layer is formed on the active layer upper portion 105 to form an ohmic contact layer. Then, the ohmic contact layer 106 and the active layer in a preset pattern are obtained by a photolithography process. The active layer is, for example, in a form of island, and the ohmic contact layer 106 may be only in the source electrode region and the drain electrode region of the active layer, respectively. Then, a layer of conductive metal such as molybdenum is formed on the ohmic contact layer 106, and then the source electrode 107 and the drain electrode 108 of thin film transistor are obtained by a photolithography process for the molybdenum layer, which are in the source electrode region and the drain electrode region of the active layer, respectively. Finally, on the source electrode 107 and the drain electrode 108, a passivation layer 109 is formed by PECVD. This passivation layer may be formed of silicon nitride and may have a thickness in a range of 230~270 nm, for example, 250 nm, so as to obtain a thin film transistor here.

Figure 3:
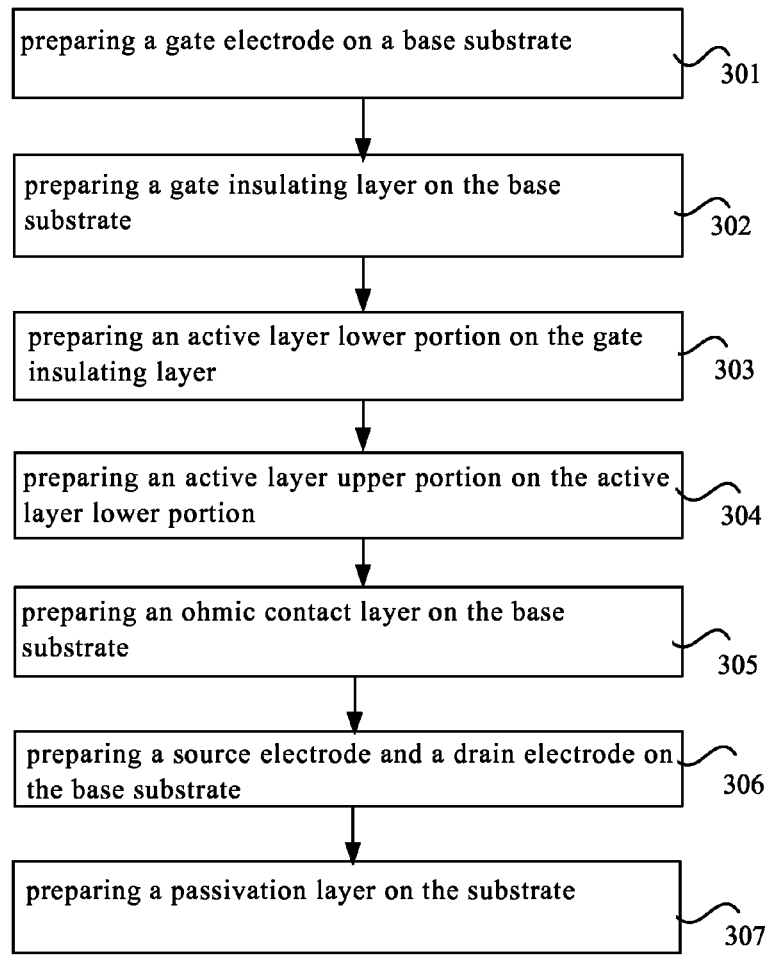
FIG. 3 is a flowchart of a second embodiment of a preparation method of the thin film transistor according to the disclosed technology.
Figure 4A:
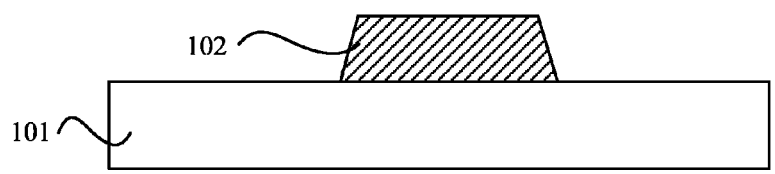
FIG. 4A is a first structure schematic view of the thin film transistor in the second embodiment.
Figure 4B:
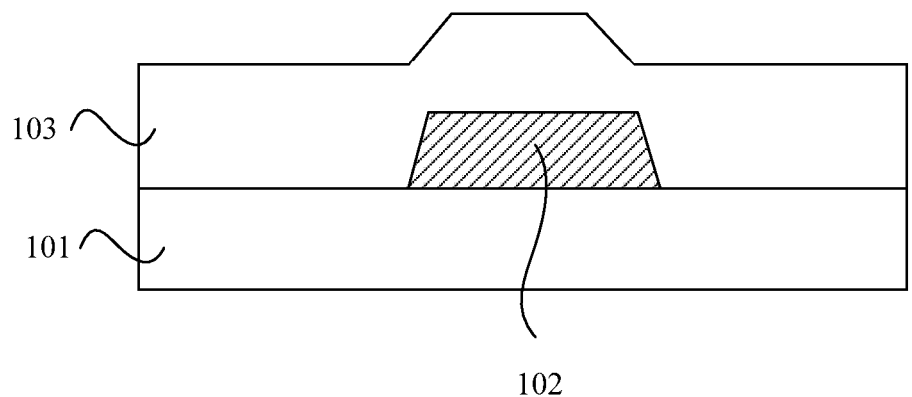
FIG. 4B is a second structure schematic view of the thin film transistor in the second embodiment.
Figure 4C:
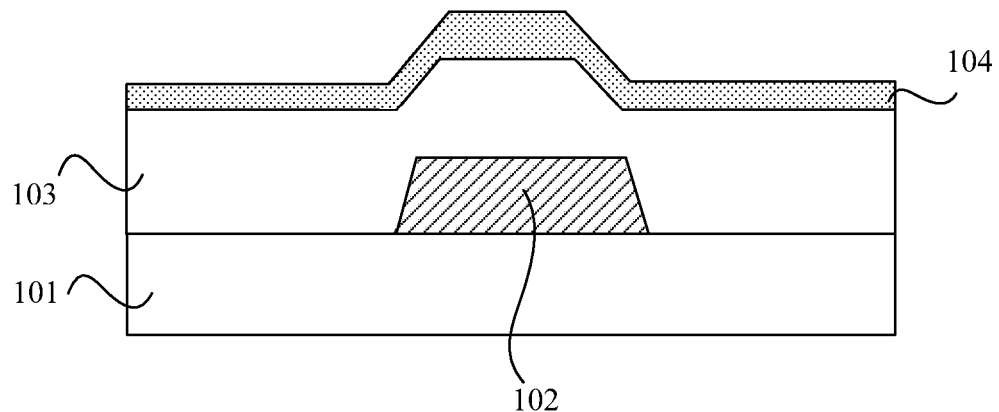
FIG. 4C is a third structure schematic view of the thin film transistor in the second embodiment.
Figure 4D:
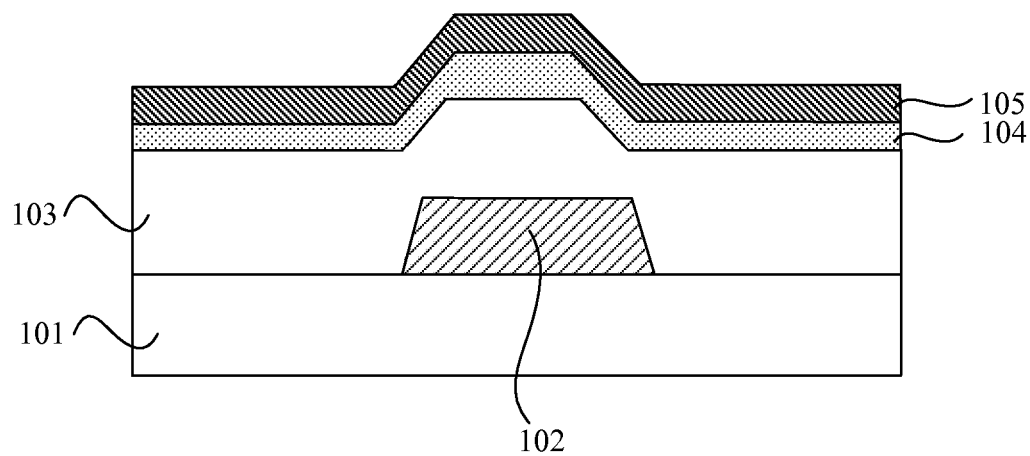
FIG. 4D is a fourth structure schematic view of the thin film transistor in the second embodiment.
Figure 4E:
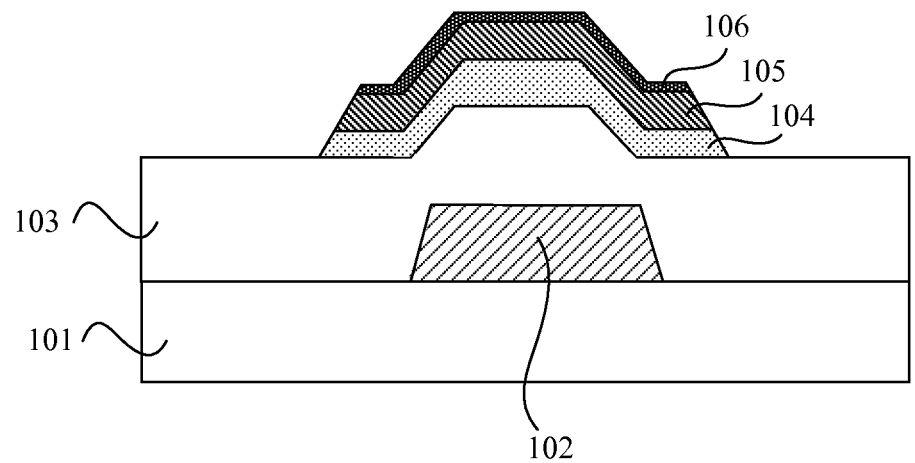
FIG. 4E is a fifth structure schematic view of the thin film transistor in the second embodiment.
Figure 4F:
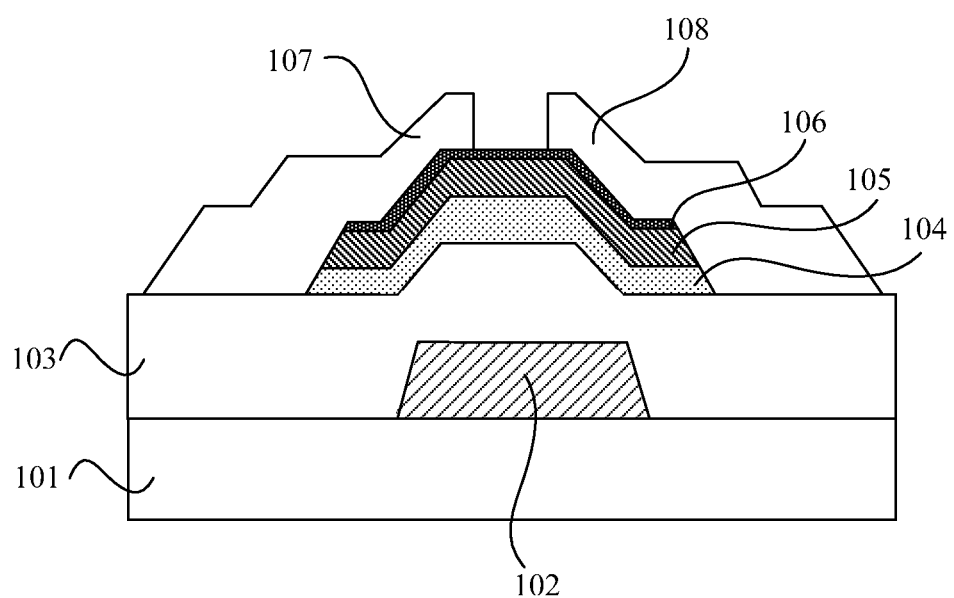
FIG. 4F is a sixth structure schematic view of the thin film transistor in the second embodiment.

In this embodiment, the active layer lower portion is a layered microcrystalline silicon which is formed from a plurality of layers of amorphous silicon treated by hydrogen plasma in a layer-by-layer manner to obtain microcrystalline silicon, to reduce the crystal boundaries and defects of the active layer lower portion, which enhances the mobility of carriers and the on/off response speed in a thin film transistor, and at the same time to decrease the power consumption of the thin film transistor. That the active layer upper portion 105 prepared with a successive deposition process may further increase the efficiency of the preparation of the thin film transistor. FIG. 3 is a flowchart of a second embodiment of a preparation method of a thin film transistor according to the disclosed technology. FIG. 4A is a first structure schematic view of a thin film transistor in the second embodiment. FIG. 4B is a second structure schematic view of the thin film transistor in the second embodiment. FIG. 4C is a third structure schematic view of the thin film transistor of the second embodiment. FIG. 4D is a fourth structure schematic view of the thin film transistor in the second embodiment. FIG. 4E is a fifth structure schematic view of the thin film transistor in the second embodiment. FIG. 4F is a sixth structure schematic view of the thin film transistor in the second embodiment.

As shown in FIG. 3, an exemplary process flow of the preparation method of a thin film transistor in this embodiment comprises the following steps.

Step 301 of Preparing a Gate Electrode on a Base Substrate.

In this step, with reference to FIG. 4A, for example, a glass or quartz substrate is used as a base substrate 101. After the base substrate 101 is cleaned in advance, a layer of molybdenum is deposited on the substrate 101 by a sputtering process, and then the molybdenum layer is subject to a photolithography process. This first photolithography comprises coating photoresist on the molybdenum layer, exposing and developing the photoresist to obtain a gate photoresist pattern, etching the molybdenum layer with the gate photoresist pattern, and removing the remaining photoresist to obtain a gate electrode 102. Then the method proceeds to step 302.

Step 302 of preparing a gate insulating layer on the base substrate after the above step.

In this step, with reference to FIG. 4B, a layer of insulating material thin film such as silicon nitride, silicon oxide or silicon oxynitride is formed by PECVD as a gate insulating layer 103, which may have a thickness of 400 nm for example, on the base substrate 101 with the gate electrode 102. After forming the gate insulating layer 103, the method proceeds to step 303.

Step 303 of Preparing an Active Layer Lower Portion on the Gate Insulating Layer.

In this step, with reference to FIG. 4C, a microcrystalline silicon thin film for an active layer lower portion 104 is prepared by a layer-by-layer growing process. The process of the layer-by-layer growing process in this embodiment may comprise steps each comprising depositing an amorphous silicon thin film, which may have a thickness in a range of 3~5 nm, for example, 4 nm, on the gate insulating layer 103 by PECVD and then treating the amorphous silicon thin film by using hydrogen plasma, which treatment may last for 20~28 s, for example, 24 s. In the treatment, hydrogen atoms in hydrogen plasma are bonded with one of Si atoms in each Si—Si bond which gives rise to stress in the amorphous silicon thin film, such that the Si atoms in amorphous silicon thin film layer can be re-arranged to convert the amorphous silicon thin film layer into a microcrystalline silicon thin film. In one example of PECVD of this step, the silane ($SiH_4$) gas has a flow rate in a range of 100~250 sccm, the hydrogen gas ($H_2$) has a flow rate in a range of 100~250 sccm, the radio-frequency power is in a range of 100~300 W, the pressure is in a range of 800~1500 mTorr, and the temperature is in a range of 350~380 Celsius degrees (° C.).

The step including the PECVD process and the hydrogen plasma treatment is repeated nine times (that is to say, the step is repeated totally ten times) in the layer-by-layer growing process in this embodiment to obtain a microcrystalline silicon thin film having a thickness of 40 nm, for example. This microcrystalline silicon thin film will be used to form the active layer lower portion 104. Then the method proceeds to step 304.

Step 304 of Preparing an Active Layer Upper Portion on the Active Layer Lower Portion.

In this step, with reference to FIG. 4D, an active layer upper portion 105 formed of microcrystalline silicon on the substrate 101 is formed after the above steps by a PECVD process. The range of the thickness of the active layer upper portion 105 may be within 100~150 nm, for example, 130 nm. Using PECVD to depositing microcrystalline silicon successively to obtain the active layer upper portion 105 in this example may improve the efficiency of preparing a thin film transistor. One example of the prepress conditions of the PECVD process in this step comprise that a silane flow in range of 10~30 sccm, a hydrogen flow in range of 1000~3000 sccm, the radio-frequency power in a range of 700~1550 W, the pressure in a range of 800~900 mTorr, and the temperature in a range of 240~270° C. After preparing the active layer upper portion 105 with a thickness of 130 nm, the method proceeds to step 305.

Step 305 of Preparing an Ohmic Contact Layer on the Base Substrate after the Above Step.

In this step, with reference to FIG. 4E, a layer of n+a-Si:H heavily-doped amorphous silicon is formed to obtain an ohmic contact layer 106, with a thickness of 50 nm for example on the active layer upper portion 105. The active layer and the ohmic contact layer 106 are patterned by a second photolithography process to obtain the patterned active layer and the ohmic contact layer in a preset pattern. Then the method proceeds to step 306.

Step 306 of Preparing a Source Electrode and a Drain Electrode on the Base Substrate after the Above Step.

In this step, with reference to FIG. 4F, a layer of metal such as molybdenum is deposited by sputtering with a thickness of 220 nm, and then the metal layer is patterned by a third photolithography to obtain a source electrode 107 and a drain electrode 108. The method proceeds to step 307.

Step 307 of Preparing a Passivation Layer on the Substrate after the Above Step.

In this step, with reference to FIG. 1, a layer of insulating material such as silicon nitride is deposited to have a thickness of 250 nm for example, on the source electrode 107 and the drain electrode 108, as a passivation layer 109 so as to obtain a thin film transistor here.

Figure 5:
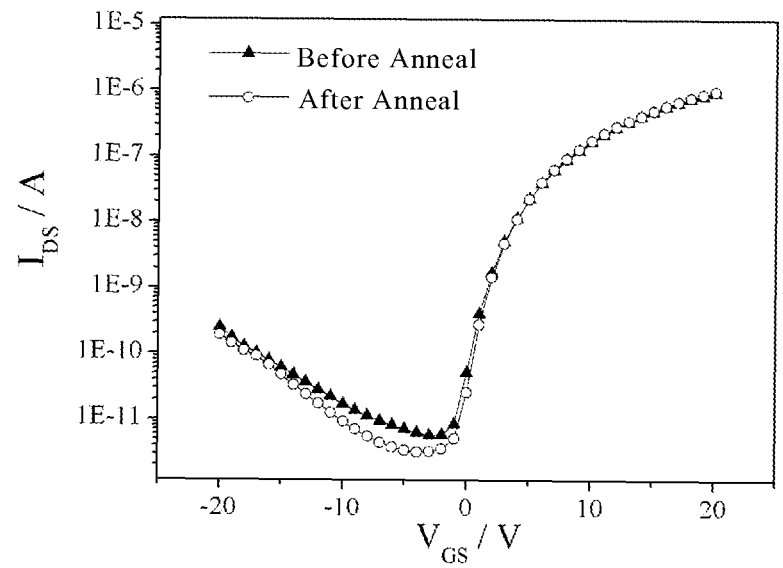
FIG. 5 is a comparison diagram of transfer property of a thin film transistor prepared in the second embodiment before and after anneal.
Figure 6:
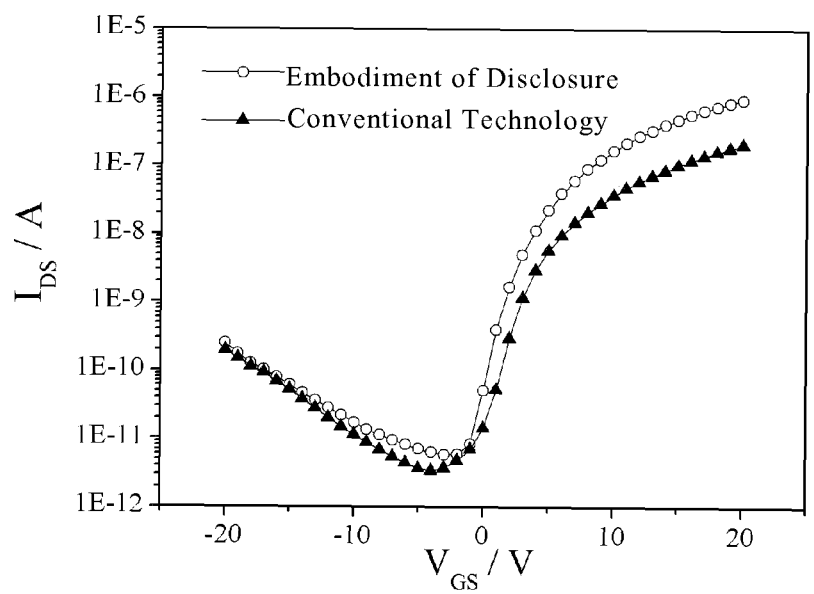
FIG. 6 is a comparison diagram of transfer property after anneal between a thin film transistor prepared in the second embodiment and that prepared in the conventional technology.

In this embodiment, the transferring properties of the thin film transistor prepared in the above method before and after anneal is detected, and for example, the time period of annealing the thin film transistor is two hours and the anneal temperature is 250° C. FIG. 5 is a comparison diagram of the transfer properties of a thin film transistor prepared in the second embodiment before and after anneal. FIG. 6 is a comparison diagram of the transfer properties after anneal between a thin film transistor prepared in the second embodiment and that prepared in the conventional method.

FIG. 5 shows a graph of source-drain current ($I_{DS}$) versus gate-source voltage ($V_{GS}$), before and after anneal, of the thin film transistor, which is prepared in the embodiment of the disclosed technology. FIG. 6 shows the relation curves of $V_{GS}$-$I_{DS}$ after anneal of the thin film transistor prepared in the embodiment of the disclosed technology and that prepared by PECVD continuously in the conventional technology. The electrical performance of the thin film transistor prepared in this embodiment before and after anneal and that of the thin film transistor prepared in the conventional technology after anneal are shown in Table 1.

TABLE 1

| | Mobility (μ) | Leakage Current ($I_{off}$) | On/Off ratio |
|---|---|---|---|
| Thin film transistor prepared in the second embodiment, before anneal | 0.185 cm$^2$/Vs | 5.83 × 10$^{-12}$ A | 1.62 × 10$^5$ |
| The thin film transistor prepared in the second embodiment, after anneal | 0.196 cm$^2$/Vs | 3.23 × 10$^{-12}$ A | 3 × 10$^5$ |

TABLE 1-continued

| | Mobility (μ) | Leakage Current ($I_{off}$) | On/Off ratio |
|---|---|---|---|
| The thin film transistor anneal prepared by the prior art, after anneal | 0.039 cm²/Vs | 3.4 × 10⁻¹² A | 3 × 10⁴ |

As shown in table 1, the thin film transistor prepared by the embodiment of the disclosed technology has the mobility of carriers about five times higher than that of the thin film transistor prepared in the conventional technology; further, in the thin film transistor prepared by the embodiment of the disclosed technology, the on/off response speed increased significantly, while the leakage current of thin film transistor is reduced.

In step 303, in the process of using a layer-by-layer growing process to prepare the active layer lower portion 104 on the gate insulating layer, the example of the process conditions in PECVD may include the range of the flow rate of silane between 100~250 sccm, the range of the flow rate of hydrogen between 100~250 sccm, the range of the radio-frequency power between 100~300 W, the range of the pressure between 800~1500 mTorr, the range of the temperature between 240~260° C., and the thickness of the amorphous silicon thin film by PECVD deposition between 0.5~2.5 nm. In an example, in the process conditions, the temperature is 250° C., the thickness of the amorphous silicon thin film after each PECVD is 1 nm, the amorphous silicon thin film is then treated by hydrogen plasma, the range of the time period of each hydrogen plasma treatment is between 70~110 s, for example, 90 s, and the combination of the PECVD and the hydrogen plasma treatment is repeated 39 times (that is to say, the combination of the PECVD and the hydrogen plasma treatment is repeated totally 40 times) to obtain the active layer lower portion 104 formed of microcrystalline silicon with a thickness of 40 nm for example.

In this embodiment, the active layer lower portion in the thin film transistor is formed of microcrystalline silicon prepared by a layer-by-layer growing process, which can effectively reduce the crystal boundaries and defects of the active layer lower portion, increase the mobility of carriers and on/off response speed in the thin film transistor, and at the same time reduce the leakage current of the thin film transistor so as to reduce the power consumption of the thin film transistor. Moreover, preparation of the active layer upper portion by a successive deposition process can increase the efficiency of the preparation of the thin film transistor.

Another embodiment of the disclosed technology provides an array substrate comprising the thin film transistor described above. In the array substrate in this embodiment, the thin film transistor can be one of the above-described embodiments, of which the active layer lower portion is formed of microcrystalline silicon prepared by a layer-by-layer growing process. The microcrystalline silicon prepared by the layer-by-layer growing process can reduce the crystal boundaries and defects of the active layer lower portion effectively, increase the mobility of carriers and on/off response speed in the thin film transistor, while reduce the leakage current of thin film transistor so as to reduce the power consumption of thin film transistor. Moreover, the active layer upper portion is prepared by a successive deposition process, which can improve the efficiency of the thin film transistor. Thus, this array substrate can reduce the crystal boundaries and defects of the active layer lower portion, increase the response time and reduce the power consumption. Such an array substrate can be used for a display panel such as a liquid crystal display (LCD) panel, an organic light-emitting display (OLED) panel, or the like.

Further another embodiment of the disclosed technology also provides a display comprising the array substrate described above. The display may be a display panel such as a liquid crystal display panel, an organic light emitting display panel or the like, as well as comprising an application device including a display panel described above, such as a mobile phone, a TV set, a monitor, a computer or the like.

Further still another embodiment of the disclosed technology provides a preparation method for an array substrate. The preparation method for the thin film transistor on an array substrate includes the preparation method for a thin film transistor described above. According to this preparation method for an array substrate, the microcrystalline silicon prepared by a layer-by-layer growing process can reduce the crystal boundaries and defects of the active layer lower portion effectively, increase the mobility of carriers and the on/off response speed in the thin film transistor, while reduce the leakage current of the thin film transistor so as to reduce the power consumption of thin film transistor. Moreover, the active layer upper portion is prepared by a successive deposition process, which can improve the efficiency of preparing the thin film transistor.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

What is claimed is:

1. A preparation method for a thin film transistor comprising:
   preparing a gate electrode and a gate insulating layer on a base substrate,
   preparing an active layer on the gate insulating layer, and
   preparing an ohmic contact layer, a source electrode, a drain electrode and a passivation layer on the active layer,
   wherein the active layer comprises an active layer lower portion that contacts the gate insulating layer and an active layer upper portion that is in direct contact with the ohmic contact layer, and preparing of the active layer on the gate insulating layer comprises:
   using a layer-by-layer growing process to prepare at least two layers of amorphous silicon thin film which are each treated by hydrogen plasma layer by layer to obtain microcrystalline silicon so as to form the active layer lower portion, and
   using a successive deposition process to prepare microcrystalline silicon so as to form the active layer upper portion.

2. The preparation method for a thin film transistor according to claim 1, wherein using the layer-by-layer growing process to prepare the active layer lower portion comprises:
   depositing an amorphous silicon thin film by plasma enhanced chemical vapor deposition (PECVD), treating the amorphous silicon thin film by hydrogen plasma; and
   repeating the PECVD and the hydrogen plasma treatment at least once to obtain the active layer lower portion.

3. The preparation method for a thin film transistor according to claim 2, wherein each of the amorphous silicon thin films has a thickness less than 10 nm.

4. The preparation method for a thin film transistor according to claim 2, wherein the PECVD has conditions comprising:
  a silane flow rate in a range of 100~250 sccm, a hydrogen flow rate in a range of 100~250 sccm, a radio-frequency power in a range of 100~300 W, a pressure in a range of 800~1500 mTorr, and a temperature in a range between 350~380° C.; and
  the amorphous silicon thin film deposited by PECVD has a thickness of 3~5 nm, and using hydrogen plasma to treat the amorphous silicon thin film has a range of time period between 20~28 s.

5. The preparation method for a thin film transistor according to claim 4, wherein
  the amorphous silicon thin film layer obtained after each PECVD deposition has a thickness of 4 nm, treating of the amorphous silicon thin film by hydrogen plasma has a time period of 24 s, and the PECVD and the hydrogen plasma treatment are repeated 9 times to obtain the active layer lower portion.

6. The preparation method for a thin film transistor according to claim 2, wherein the PECVD has conditions comprising:
  a silane flow rate in a range of 100~250 sccm, a hydrogen flow rate in a range of 100~250 sccm, a radio-frequency power in a range of 100~300 W, a pressure in a range of 800~1500 mTorr, and a temperature in a range between 240~260° C.; and
  the amorphous silicon thin film deposited by PECVD has a thickness of 0.5~2.5 nm, and using hydrogen plasma to treat the amorphous silicon thin film has a range of time period between 70~110 s.

7. The preparation method for a thin film transistor according to claim 6, wherein the amorphous silicon thin film after each PECVD deposition has a thickness of 1 nm, using hydrogen plasma to treat the amorphous silicon thin film has a time period of 90 s, and the PECVD and hydrogen plasma treatment are repeated 39 times to obtain the active layer lower portion.

8. The preparation method for a thin film transistor according to claim 1, wherein using successive deposition process to prepare the active layer upper portion comprises:
  using PECVD, low pressure chemical vapor deposition, hot wire chemical vapor deposition or sputtering to perform a successively deposition to prepare the active layer upper portion.

9. The preparation method for a thin film transistor according to claim 8, wherein using PECVD to prepare the active layer upper portion has process conditions comprising:
  a silane flow rate in a range of 10~30 sccm, a hydrogen flow rate in a range of 1000~3000 sccm, a radio-frequency power in a range between 700~1550 W, a pressure in a range of 800~900 mTorr, and a temperature in a range of 240~270° C.

* * * * *